(12) United States Patent
Lee et al.

(10) Patent No.: US 12,300,679 B2
(45) Date of Patent: May 13, 2025

(54) SEMICONDUCTOR PACKAGE STRUCTURE

(71) Applicant: MEDIATEK INC., Hsinchu (TW)

(72) Inventors: Yi-Jyun Lee, Hsinchu (TW); Duen-Yi Ho, Hsinchu (TW); Hsing-Chih Liu, Hsinchu (TW); Che-Hung Kuo, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 429 days.

(21) Appl. No.: 17/739,295

(22) Filed: May 9, 2022

(65) Prior Publication Data

US 2022/0367430 A1  Nov. 17, 2022

Related U.S. Application Data

(60) Provisional application No. 63/189,256, filed on May 17, 2021.

(51) Int. Cl.
*H01L 23/48* (2006.01)
*H01L 23/498* (2006.01)
(Continued)

(52) U.S. Cl.
CPC ...... *H01L 25/162* (2013.01); *H01L 23/49816* (2013.01); *H01L 23/49833* (2013.01); *H01L 23/49838* (2013.01); *H01L 28/90* (2013.01); *H01L 24/16* (2013.01); *H01L 2224/16235* (2013.01); *H01L 2924/30105* (2013.01); *H01L 2924/3025* (2013.01); *H01L 2924/3511* (2013.01)

(58) Field of Classification Search
CPC ............. H01L 23/49833; H01L 25/162; H01L 2924/30105

USPC ......................................................... 257/724
See application file for complete search history.

(56) References Cited

U.S. PATENT DOCUMENTS

| 7,102,227 B2* | 9/2006 | Terui | H01C 13/02 257/E27.111 |
| 8,907,451 B2* | 12/2014 | Kim | H01L 28/40 257/532 |

(Continued)

OTHER PUBLICATIONS

Partial European Search Report dated Dec. 12, 2022, issued in application No. EP 22173521.0.

(Continued)

*Primary Examiner* — Nitin Parekh
(74) *Attorney, Agent, or Firm* — McClure, Qualey & Rodack, LLP

(57) ABSTRACT

A semiconductor package structure includes a substrate, a redistribution layer, a first semiconductor die, and a first capacitor. The substrate has a wiring structure. The redistribution layer is disposed over the substrate. The first semiconductor die is disposed over the redistribution layer. The first capacitor is disposed in the substrate and is electrically coupled to the first semiconductor die. The first capacitor includes a first capacitor substrate, a plurality of first capacitor cells, and a first through via. The first capacitor substrate has a first top surface and a first bottom surface. The first capacitor cells are disposed in the first capacitor substrate. The first through via is disposed in the first capacitor substrate and electrically couples the first capacitor cells to the wiring structure on the first top surface and the first bottom surface.

19 Claims, 9 Drawing Sheets

(51) Int. Cl.
*H01L 25/16* (2023.01)
*H01L 49/02* (2006.01)
H01L 23/00 (2006.01)

(56) References Cited

U.S. PATENT DOCUMENTS

| | | | |
|---|---|---|---|
| 11,417,637 B2* | 8/2022 | Kim | H01L 21/4857 |
| 11,652,062 B2* | 5/2023 | Parto | H01L 23/49822 |
| | | | 713/320 |
| 2004/0027813 A1 | 2/2004 | Li | |
| 2004/0124511 A1 | 7/2004 | Li | |
| 2006/0012966 A1 | 1/2006 | Chakravorty | |
| 2007/0045815 A1 | 3/2007 | Urashima et al. | |
| 2011/0018099 A1 | 1/2011 | Muramatsu | |
| 2014/0252544 A1 | 9/2014 | Li et al. | |
| 2015/0041955 A1 | 2/2015 | Zerbe et al. | |
| 2015/0294791 A1 | 10/2015 | Hwang et al. | |
| 2016/0183378 A1 | 6/2016 | Hwang et al. | |
| 2017/0064837 A1 | 3/2017 | Li et al. | |
| 2019/0157152 A1 | 5/2019 | Sharan et al. | |
| 2020/0091063 A1* | 3/2020 | Chen | H01L 25/0657 |

OTHER PUBLICATIONS

Chinese language office action dated Jun. 20, 2023, issued in application No. TW 111118169.
Extended European Search Report dated Mar. 28, 2023, issued in application No. EP 22173521.0.
Lin, Y., et al.; "Dielectric Quality of 3D Capacitor Embedded in Through-Silicon Via (TSV);" 2018 IEEE 68th Electronic Components and Technology Conference; Jun. 2018; pp. 1158-1163.

* cited by examiner

SEMICONDUCTOR PACKAGE STRUCTURE

CROSS REFERENCE TO RELATED APPLICATIONS

This application claims the benefit of U.S. Provisional Application No. 63/189,256 filed on May 17, 2021, the entirety of which are incorporated by reference herein.

BACKGROUND OF THE INVENTION

Field of the Invention

The present invention is related to semiconductor packaging technology, and in particular to a semiconductor package structure that includes a capacitor.

Description of the Related Art

A supply voltage is provided to supply the power needed for electronic circuits to operate. During operation, the supply voltage may supply transient currents with a relatively high intensity, which results in improper operation of the electronic circuits. In order to provide a more stable power supply, decoupling capacitors are connected between the supply voltage and ground to provide a bypass path for transient currents. That is, the decoupling capacitors function as temporary charge reservoirs.

In addition, the decoupling capacitors can reduce the impact of electromagnetic interference (EMI) issues and improve signal performance by stabilizing current flow. As semiconductor package structures are gradually miniaturized, the problem of EMI increases dramatically, so does the importance of decoupling capacitors.

However, although existing semiconductor package structures are generally adequate, they have not been satisfactory in every respect. For example, bump structures are removed for land-side capacitors (LSC). This reduces current density and heat dissipation paths. Heat is generated during operation of the semiconductor die. If the heat is not adequately removed, the increased temperature may result in damage to the semiconductor components. Therefore, further improvements to the semiconductor package structures are required.

BRIEF SUMMARY OF THE INVENTION

Semiconductor package structures are provided. An exemplary embodiment of a semiconductor package structure includes a substrate, a redistribution layer, a first semiconductor die, and a first capacitor. The substrate has a wiring structure. The redistribution layer is disposed over the substrate. The first semiconductor die is disposed over the redistribution layer. The first capacitor is disposed in the substrate and is electrically coupled to the first semiconductor die. The first capacitor includes a first capacitor substrate, a plurality of first capacitor cells, and a first through via. The first capacitor substrate has a first top surface and a first bottom surface. The plurality of first capacitor cells are disposed in the first capacitor substrate. The first through via is disposed in the first capacitor substrate and electrically couples the plurality of first capacitor cells to the wiring structure of the substrate on the first top surface and the first bottom surface of the first capacitor substrate.

Another exemplary embodiment of a semiconductor package structure includes a substrate, a redistribution layer, a first semiconductor die, a second semiconductor die, and a first multi-capacitor structure. The substrate has a wiring structure. The redistribution layer is disposed over the substrate. The first semiconductor die and a second semiconductor die are disposed over the redistribution layer. The first multi-capacitor structure is disposed between the redistribution layer and the substrate and is electrically coupled to the first semiconductor die and the second semiconductor die. The first multi-capacitor structure includes a capacitor substrate, a plurality of capacitor cells, and a first through via. The plurality of capacitor cells are disposed in the capacitor substrate. The first through via is disposed in the capacitor substrate and electrically couples the plurality of capacitor cells to the redistribution layer and the wiring structure of the substrate.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
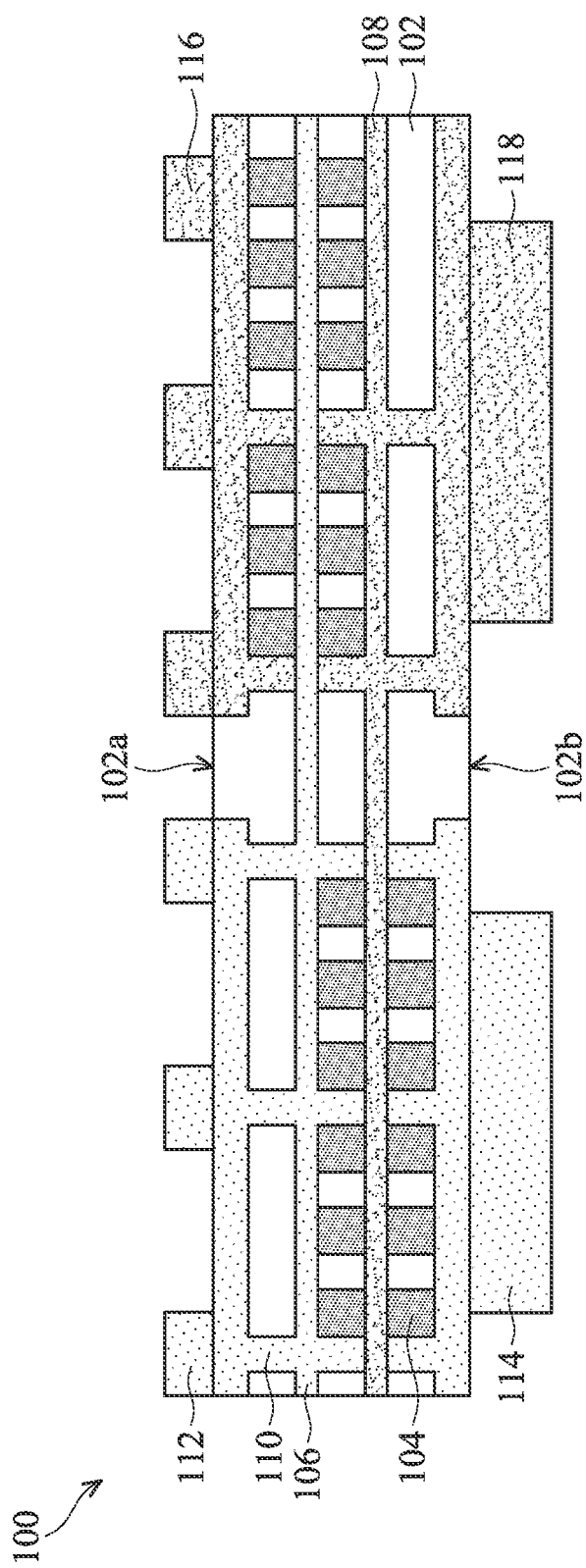
FIG. 1 is a cross-sectional view of an exemplary capacitor in accordance with some embodiments.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "forming a first element on a second element" may include embodiments in which the first element is in direct contact with the second element, and may also include embodiments in which additional elements are disposed between the first element and the second element such that the first element and the second element are not in direct contact. Furthermore, spatially relative descriptors of the first element and the second element may change as the device is operated or used in different orientations.

In the following description, the description of "a first element extending through a second element" may include embodiments in which the first element is disposed in the second element and extends from a side of the second element to an opposite side of the second element, wherein a surface of the first element may be leveled with a surface of the second element, or a surface of the first element may be outside a surface of the second element. In addition, the present disclosure may repeat reference numerals and/or letters in the various embodiments. This repetition is for simplicity and clarity and does not in itself dictate a relationship between the various embodiments discussed.

A semiconductor package structure that includes a capacitor is described in accordance with some embodiments of the present disclosure. The capacitor includes a through via extending through a capacitor substrate, so that the capacitor can be electrically coupled to other components on both surfaces of the capacitor. As a result, there can be more flexibility in the design.

FIG. 1 is a cross-sectional view of a capacitor 100 in accordance with some embodiments of the present disclosure. Additional features can be added to the capacitor 100. Some of the features described below can be replaced or eliminated for different embodiments. To simplify the diagram, only a portion of the capacitor 100 is illustrated.

As shown in FIG. 1, the capacitor 100 includes a capacitor substrate 102, in accordance with some embodiments. The capacitor substrate 102 may be a semiconductor substrate. The capacitor substrate 102 may include a bulk semiconductor, a compound semiconductor, an alloy semiconductor, the like, or a combination thereof. The capacitor substrate 102 may be formed of any suitable semiconductor material, such as silicon. The capacitor substrate 102 may be doped (e.g., using p-type or n-type dopants) or undoped. The capacitor substrate 102 has a first surface 102a and a second surface 102b opposite thereto.

As shown in FIG. 1, the capacitor 100 has a plurality of capacitor cells 104 embedded in the capacitor substrate 102, in accordance with some embodiments. Some of the capacitor cells 104 may adjacent to the first surface 102a of the capacitor substrate 102 and some of the capacitor cells 104 may adjacent to the second surface 102b of the capacitor substrate 102. It should be noted that the configuration and number of the capacitor cells 104 shown in the figures are exemplary only and are not intended to limit the present disclosure.

As shown in FIG. 1, the capacitor 100 may have one or more power lines 106 and one or more ground lines 108, which may be electrically coupled to the capacitor cells 104. The power lines 106 and the ground lines 108 may be formed of conductive material, including copper, aluminum, tungsten, the like, an alloy thereof, or a combination thereof. Each of the capacitor cells 104 may be electrically coupled to the power line 106 and the ground line 108 on opposite sides of the capacitor cell 104.

As shown in FIG. 1, the capacitor 100 has one or more through vias 110 disposed in the capacitor substrate 102 and electrically coupled to the power lines 106 and the ground lines 108, in accordance with some embodiments. The through vias 110 may be formed of conductive material, including copper, aluminum, tungsten, the like, an alloy thereof, or a combination thereof.

As shown in FIG. 1, the through vias 110 extends from the first surface 102a to the second surface 102b of the capacitor substrate 102, in accordance with some embodiments. As a result, the capacitor 100 can be electrically coupled to other components on both of the first surface 102a and the second surface 102b. Compared to embodiments in which the capacitor is electrically coupled to components on one surface, the capacitor 100 of the present disclosure can offer more flexibility in the design of the semiconductor package structure. In addition, the current density can be increased, and the efficiency of thermal dissipation can be elevated.

As shown in FIG. 1, the capacitor 100 has one or more power terminals 112 and ground terminals 116 on the first surface 102a of the capacitor substrate 102, and one or more power terminals 114 and ground terminals 118 on the second surface 102b of the capacitor substrate 102, in accordance with some embodiments. The power terminals 112, 114 and the ground terminals 116, 118 may be electrically coupled to the capacitor cells 104 through the power lines 106, the ground lines 108, and the through vias 110. The power terminals 112, 114 and the ground terminals 116, 118 may be formed of conductive material, including copper, aluminum, tungsten, the like, an alloy thereof, or a combination thereof.

The dimensions (such as widths) of the power terminals 112, 114 and the ground terminals 116, 118 may depend on the components which they are electrically coupled to. For example, in some embodiments where there are more components electrically coupled to the capacitor 100 on the second surface 102b than the first surface 102a, the dimensions (such as widths) of the power terminals 114 and the ground terminals 118 may be greater than the dimensions (such as widths) of the power terminals 112 and the ground terminals 116, as shown in FIG. 1.

Figure 2:
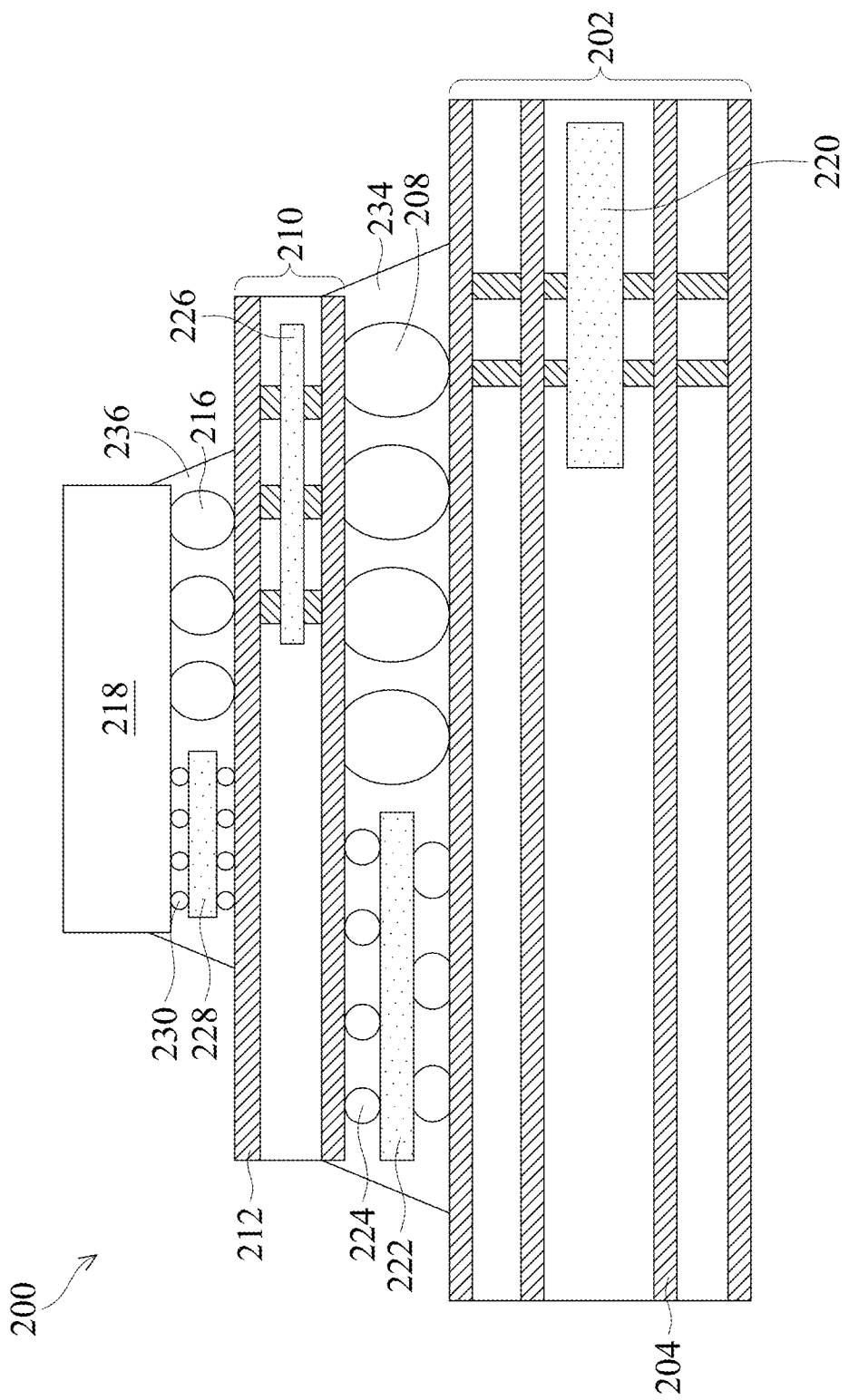
FIG. 2 is a cross-sectional view of an exemplary semiconductor package structure in accordance with some embodiments.

FIG. 2 is a cross-sectional view of a semiconductor package structure 200, in accordance with some embodiments of the present disclosure. Additional features can be added to the semiconductor package structure 200. Some of the features described below can be replaced or eliminated for different embodiments. To simplify the diagram, only a portion of the semiconductor package structure 200 is illustrated. In the following embodiments, the semiconductor package structure 200 includes one or more capacitors which have one or more through vias.

As shown in FIG. 2, the semiconductor package structure 200 includes a substrate 202, in accordance with some embodiments. The substrate 202 may be a coreless substrate or a cored substrate to prevent the substrate 202 from warpage. The substrate 202 may have a wiring structure 204 therein. In some embodiments, the wiring structure 204 includes conductive pads, conductive vias, conductive lines, conductive pillars, the like, or a combination thereof. The wiring structure 204 may be formed of conductive material, including copper, aluminum, tungsten, the like, an alloy thereof, or a combination thereof.

The wiring structure 204 may be disposed in inter-metal dielectric (IMD) layers. In some embodiments, the IMD layers may be formed of organic materials, such as a polymer base material, non-organic materials, including silicon nitride, silicon oxide, silicon oxynitride, the like, or a combination thereof.

It should be noted that the configuration of the substrate 202 shown in the figures is exemplary only and is not intended to limit the present disclosure. Any desired semiconductor element may be formed in and on the substrate 202. However, in order to simplify the diagram, only the flat substrate 202 is illustrated.

As shown in FIG. 2, the semiconductor package structure 200 includes a redistribution layer 210 disposed over the substrate 202, in accordance with some embodiments. The redistribution layer 210 may include one or more conductive layers 212 disposed in one or more passivation layers. The conductive layers 212 may be formed of conductive material, including copper, aluminum, tungsten, the like, an alloy thereof, or a combination thereof. In some embodiments, the passivation layers include a polymer layer, for example, polyimide (PI), polybenzoxazole (PBO), benzocyclobutene (BCB), epoxy, the like, or a combination thereof. Alternatively, the passivation layers may include a dielectric layer, including silicon oxide, silicon nitride, silicon oxynitride, the like, or a combination thereof.

As shown in FIG. 2, the semiconductor package structure 200 includes a plurality of bump structures 208 disposed between the redistribution layer 210 and the substrate 202 and electrically coupling the redistribution layer 210 to the substrate 202, in accordance with some embodiments. The bump structures 208 may include microbumps, controlled collapse chip connection (C4) bumps, solder balls, ball grid array (BGA) balls, the like, or a combination thereof. The bump structures 208 may be formed of conductive material, including copper, aluminum, tungsten, the like, an alloy thereof, or a combination thereof.

As shown in FIG. 2, the semiconductor package structure 200 includes one or more semiconductor dies 218 disposed over the redistribution layer 210, in accordance with some embodiments. In some embodiments, the semiconductor dies 218 include a system-on-chip (SoC) die, a logic device, a memory device, a radio frequency (RF) device, the like, or any combination thereof. For example, the semiconductor dies 218 may include a micro control unit (MCU) die, a microprocessor unit (MPU) die, a power management integrated circuit (PMIC) die, a global positioning system (GPS) device, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), the like, or any combination thereof.

The semiconductor dies 218 may include one semiconductor die or two or more semiconductor dies which may be stacked vertically. In some embodiments, the semiconductor package structure 200 also includes one or more passive components (not illustrated) adjacent to the semiconductor dies 218, such as resistors, capacitors, inductors, the like, or a combination thereof.

As shown in FIG. 2, the semiconductor package structure 200 includes a plurality of bump structures 216 disposed between the semiconductor dies 218 and the redistribution layer 210 and electrically coupling the semiconductor dies 218 to the redistribution layer 210, in accordance with some embodiments. The bump structures 216 may include microbumps, controlled collapse chip connection (C4) bumps, solder balls, ball grid array (BGA) balls, the like, or a combination thereof. The bump structures 216 may be formed of conductive material, including copper, aluminum, tungsten, the like, an alloy thereof, or a combination thereof.

As shown in FIG. 2, the semiconductor package structure 200 includes one or more capacitors electrically coupled to the semiconductor dies 218, in accordance with some embodiments. In an embodiment, the semiconductor package structure 200 includes a capacitor 220 embedded in the substrate 202. The capacitor 220 may be electrically coupled to the semiconductor dies 218 through the wiring structure 204 of the substrate 202, the bump structures 208, the conductive layers 212 of the redistribution layer 210, and the bump structures 216. This embodiment will be described with reference to FIG. 3.

Figure 3:
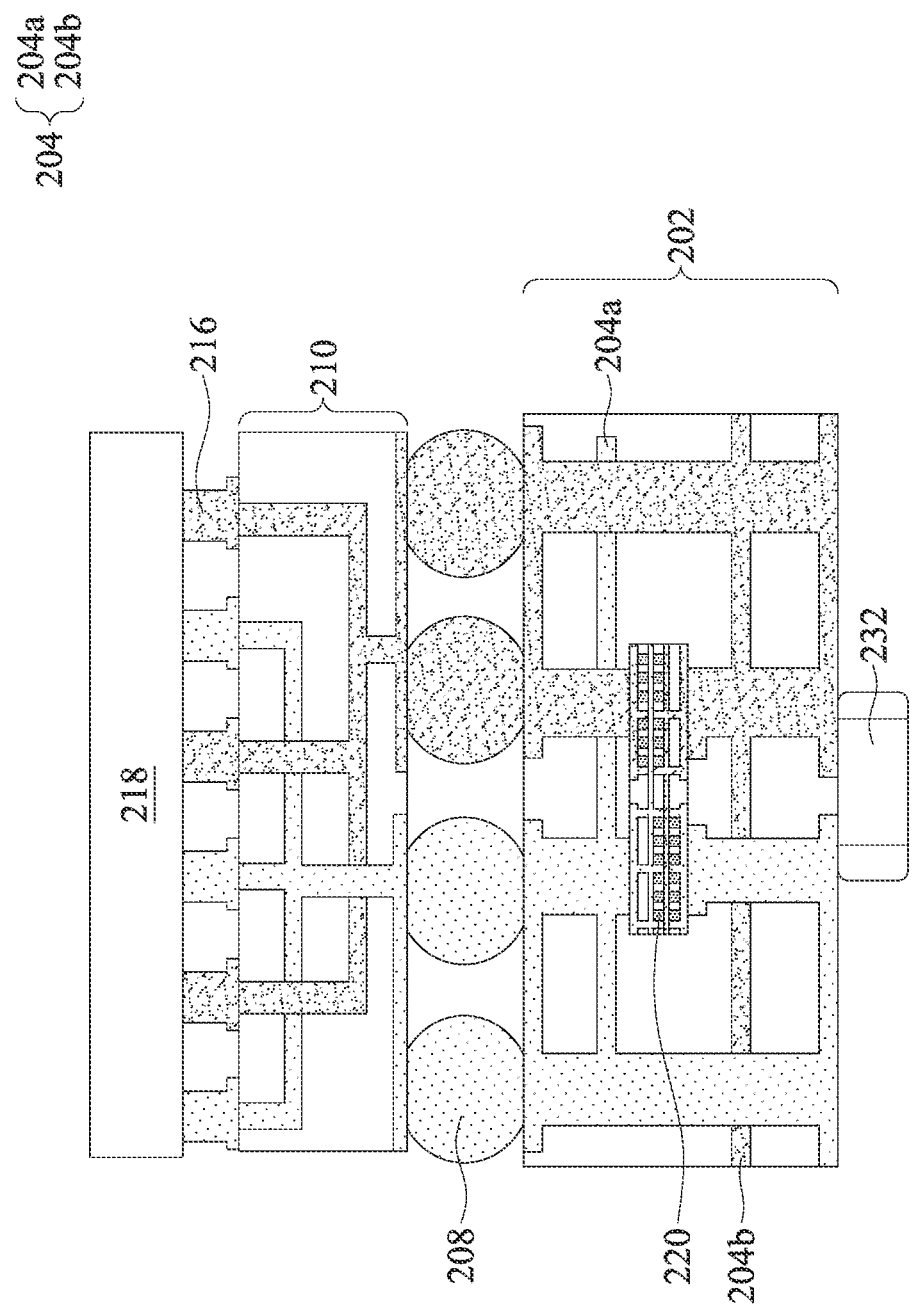
FIG. 3 is a cross-sectional view of a portion of an exemplary semiconductor package structure in accordance with some embodiments.

FIG. 3 is a cross-sectional view of a portion of the semiconductor package structure, in accordance with some embodiments of the present disclosure. Some of the components as shown in FIG. 3 may be similar to some components of the semiconductor package structure 200 as shown in FIG. 2, and for the sake of simplicity, those components will not be discussed in detail again.

As shown in FIG. 3, the wiring structure 204 of the substrate 202 may have power components 204a and ground components 204b, which may each include conductive pads, conductive vias, conductive lines, conductive pillars, the like, or a combination thereof. As shown in FIG. 3, the conductive vias of the power components 204a and the ground components 204b are disposed on both surfaces of the capacitor 220 and are electrically coupled to the capacitor cells through the through vias of the capacitor 220, in accordance with some embodiments.

In some embodiments, the conductive vias of the power features 204a and the ground features 204b may be in contact with the both surfaces of the capacitor 220 and may electrically couple the capacitor 220 to the conductive lines of the power features 204a and the ground features 204b. Alternatively, in another embodiments, the conductive lines of the power features 204a and the ground features 204b may be in contact with the both surfaces of the capacitor 220.

As shown in FIG. 3, the semiconductor package structure 200 may also include a capacitor 232 disposed below the substrate 202 and electrically coupled to the wiring structure 204. The capacitor 232 may be an integrated passive device (IPD) to enhance electrical properties.

Referring back to FIG. 2, in an embodiment, the semiconductor package structure 200 includes a capacitor 222 and a plurality of bump structures 224 between the redistribution layer 210 and the substrate 202. The bump structures 224 may be disposed on both surfaces of the capacitor 222. The capacitor 222 may be electrically coupled to the semiconductor dies 218 through the bump structures 224, the conductive layers 212 of the redistribution layer 210, and the bump structures 216. This embodiment will be described with reference to FIG. 4.

Figure 4:
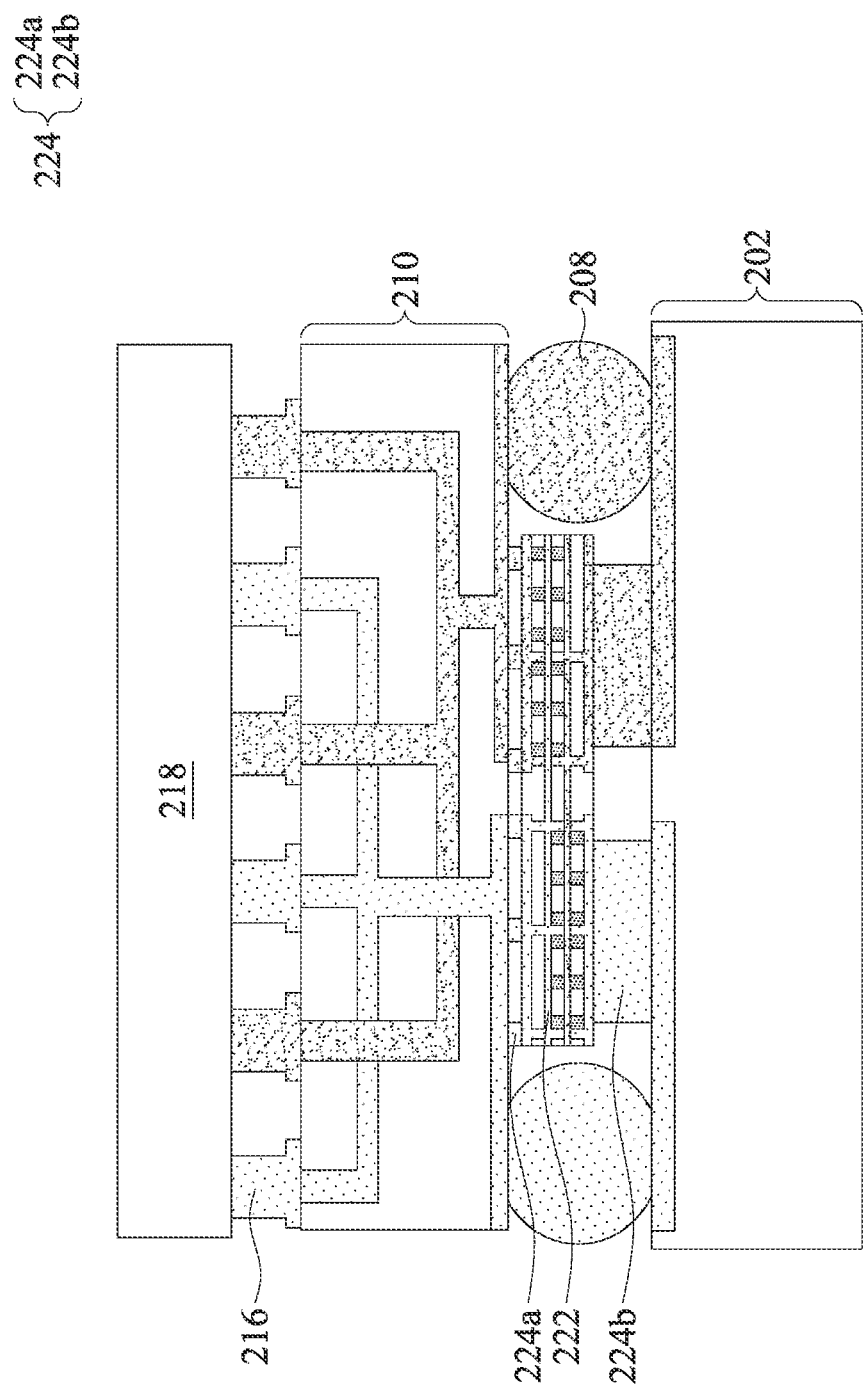
FIG. 4 is a cross-sectional view of a portion of an exemplary semiconductor package structure in accordance with some embodiments.

FIG. 4 is a cross-sectional view of a portion of the semiconductor package structure, in accordance with some embodiments of the present disclosure. Some of the components as shown in FIG. 4 may be similar to some components of the semiconductor package structure 200 as shown in FIG. 2, and for the sake of simplicity, those components will not be discussed in detail again.

As shown in FIG. 4, the capacitor 222 is electrically coupled to the bump structures 224, wherein the first surface of the capacitor 222 is electrically coupled to the first bump structures 224a, and the second surface of the capacitor 222 is electrically coupled to the second bump structures 224b, in accordance with some embodiments of the present disclosure. The first bump structures 224a may electrically couple the capacitor 222 to the redistribution layer 210, and the second bump structures 224b may electrically couple the capacitor 222 to the substrate 202.

Since the capacitor 222 can be connected to on both surfaces, bump structures 224 can be maintained on the both surfaces of the capacitor 222. Consequently, the thermal dissipation path can be increased, and the efficiency of thermal dissipation can be improved. In addition, semiconductor package structures with high current density can be achieved. Furthermore, the pin map can be freely assigned.

The dimensions (such as widths) of the first bump structures 224a and the second bump structures 224b may be different since they may be electrically coupled to different components. For example, the dimensions (such as widths) of the second bump structures 224b may be greater than the dimensions (such as widths) of the first bump structures 224a, as shown in FIG. 4.

As shown in FIG. 4, the total thickness of one of the first bump structures 224a, one of the second bump structures 224b, and the capacitor 222 may be substantially equal to the thickness of one of the bump structures 208.

An underfill material (234 shown in FIG. 2) may be formed between the redistribution layer 210 and the substrate 202 and may fill in gaps between the capacitor 222 and the bump structures 208 and 224 to provide structural support. The underfill material may surround each of the capacitor 222 and the bump structures 208 and 224. In some embodiments, the underfill material is formed of polymer, such as epoxy. The underfill material may be dispensed with capillary force, and then be cured through any suitable curing process.

Referring back to FIG. 2, in an embodiment, the semiconductor package structure 200 includes a capacitor 226 embedded in the redistribution layer 210. The capacitor 226 may be electrically coupled to the semiconductor dies 218 through the conductive layers 212 of the redistribution layer 210 and the bump structures 216. This embodiment will be described with reference to FIG. 5.

Figure 5:
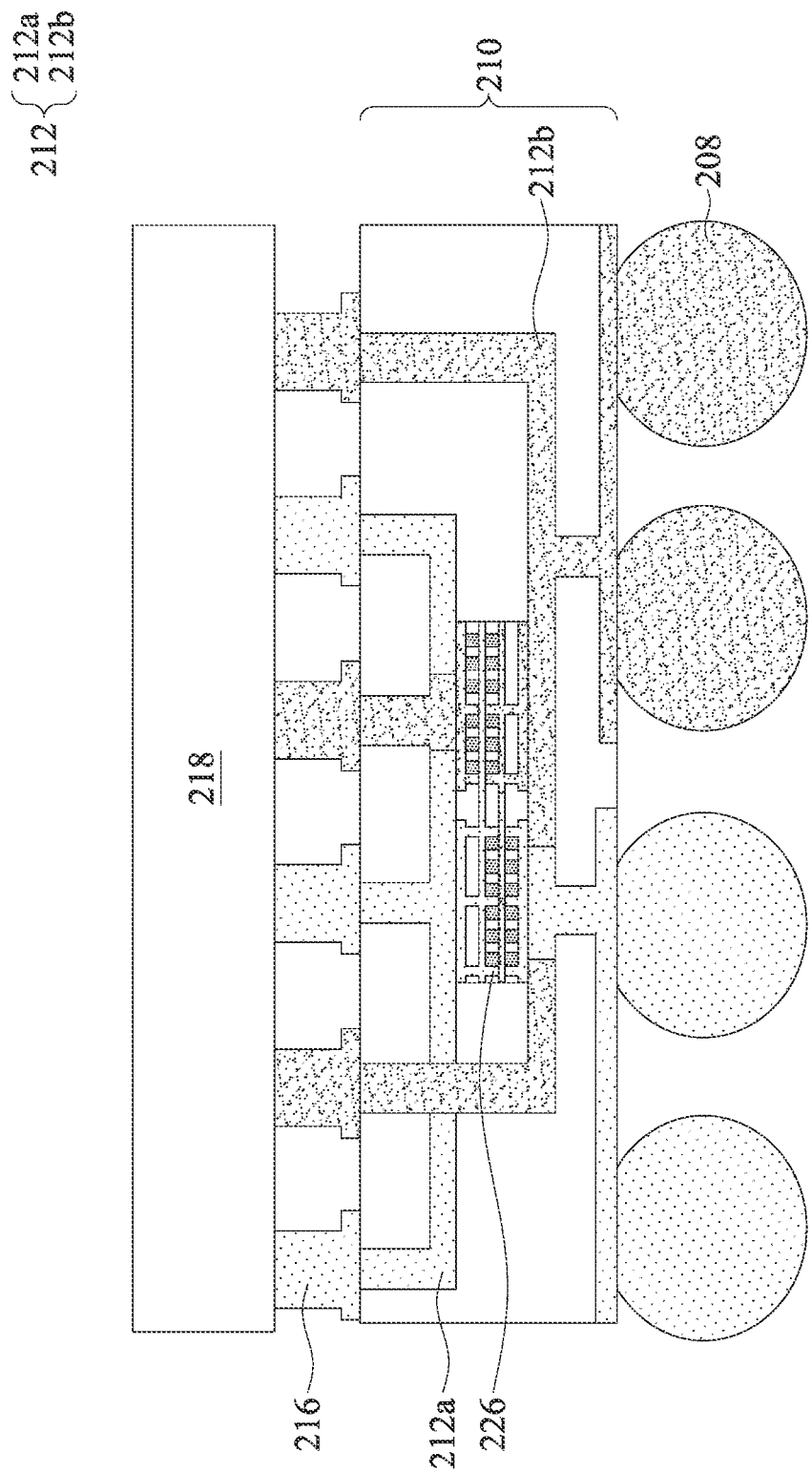
FIG. 5 is a cross-sectional view of a portion of an exemplary semiconductor package structure in accordance with some embodiments.

FIG. 5 is a cross-sectional view of a portion of the semiconductor package structure, in accordance with some embodiments of the present disclosure. Some of the components as shown in FIG. 5 may be similar to some components of the semiconductor package structure 200 as shown in FIG. 2, and for the sake of simplicity, those components will not be discussed in detail again.

As shown in FIG. 5, the conductive layers 212 of the redistribution layer 210 may have power components 212a and ground components 212b, which may include conductive pads, conductive vias, conductive lines, conductive pillars, the like, or a combination thereof. As shown in FIG. 5, the conductive vias of the power components 212a and the ground components 212b are disposed on both surfaces of the capacitor 226 and are electrically coupled to the capacitor cells through the through vias of the capacitor 226, in accordance with some embodiments.

In some embodiments, the conductive vias of the power features 212a and the ground features 212b may be in contact with the both surfaces of the capacitor 226 and electrically couple the capacitor 226 to the conductive lines of the power features 212a and the ground features 212b. Alternatively, in another embodiments, the conductive lines of the power features 212a and the ground features 212b may be in contact with the both surfaces of the capacitor 226.

Referring back to FIG. 2, in an embodiment, the semiconductor package structure 200 includes a capacitor 228 and a plurality of bump structures 230 between the semiconductor dies 218 and the redistribution layer 210. The bump structures 230 may be disposed on both surfaces of the capacitor 228. The capacitor 228 may be electrically coupled to the semiconductor dies 218 through the bump structures 230. This embodiment will be described with reference to FIG. 6.

Figure 6:
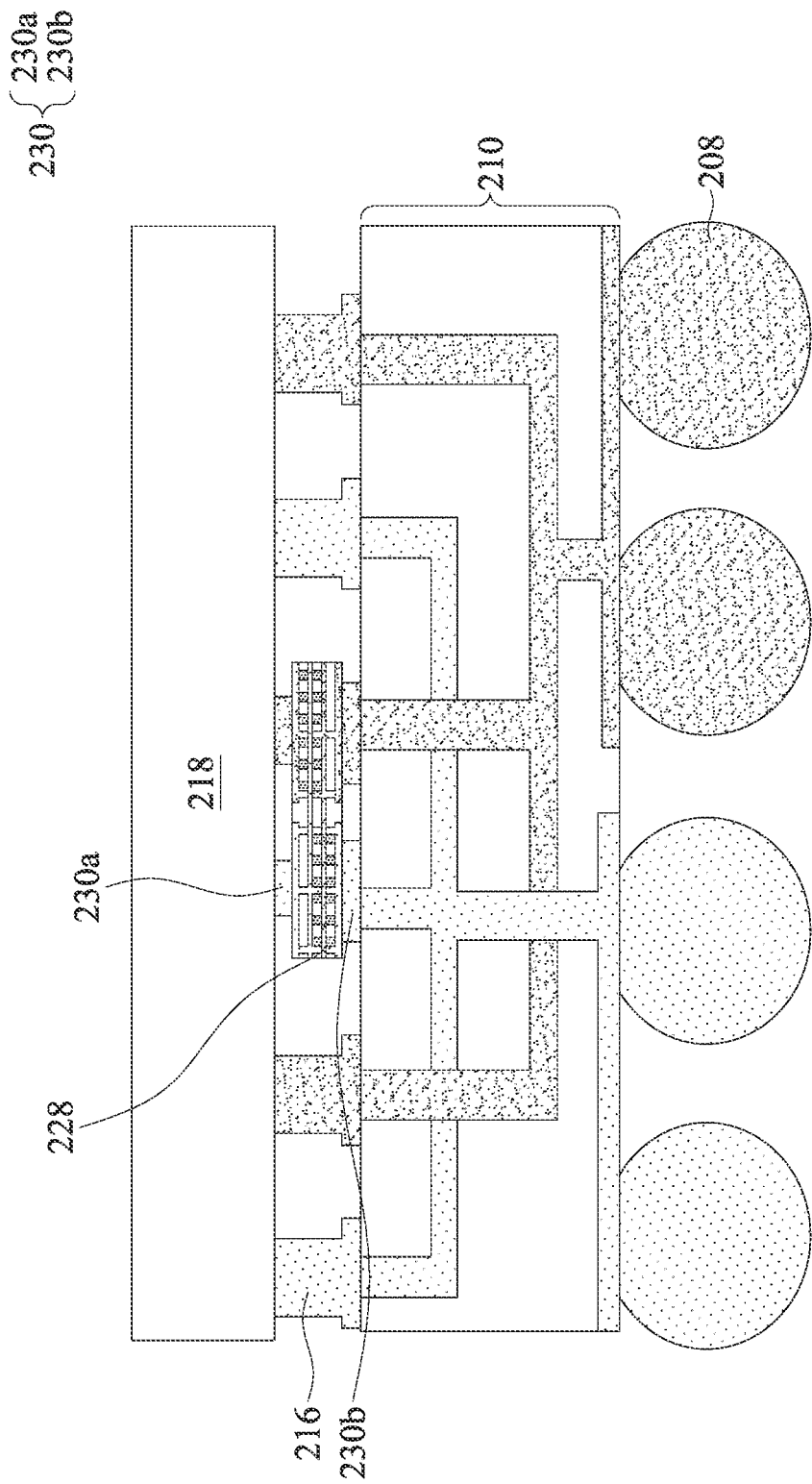
FIG. 6 is a cross-sectional view of a portion of an exemplary semiconductor package structure in accordance with some embodiments.

FIG. 6 is a cross-sectional view of a portion of the semiconductor package structure, in accordance with some embodiments of the present disclosure. Some of the components as shown in FIG. 6 may be similar to some components of the semiconductor package structure 200 as shown in FIG. 2, and for the sake of simplicity, those components will not be discussed in detail again.

As shown in FIG. 6, the capacitor 228 is electrically coupled to the bump structures 230, wherein the first surface of the capacitor 228 is electrically coupled to first bump structures 230a, and the second surface of the capacitor 228 is electrically coupled to second bump structures 230b, in accordance with some embodiments of the present disclosure. The first bump structures 230a may electrically couple the capacitor 228 to the semiconductor dies 218, and the second bump structures 224b may electrically couple the capacitor 228 to the redistribution layer 210.

As mentioned above, the dimensions (such as widths) of the first bump structures 230a and the second bump structures 230b may be different since they may be electrically coupled to different components. For example, the dimensions (such as widths) of the second bump structures 230b may be greater than the dimensions (such as widths) of the first bump structures 230a, as shown in FIG. 6.

As shown in FIG. 6, the total thickness of one of the first bump structures 230a, one of the second bump structures 230b, and the capacitor 228 may be substantially equal to the thickness of one of the bump structures 216.

An underfill material (236 shown in FIG. 2) may be formed between the semiconductor dies 218 and the redistribution layer 210 and may fill in gaps between the capacitor 228 and the bump structures 216 and 230 to provide structural support. The underfill material may surround each of the capacitor 228 and the bump structures 216 and 230. In some embodiments, the underfill material is formed of polymer, such as epoxy. The underfill material may be dispensed with capillary force, and then be cured through any suitable curing process.

Referring back to FIG. 2. Although the capacitors 220, 222, 226, 228 are described separately, the semiconductor package structure 200 may include more than one capacitors 220, 222, 226, 228, which may each be electrically coupled to each of the semiconductor dies 218. For example, in an embodiment, the semiconductor package structure 200 may include the capacitors 220 and 222, wherein the capacitor 220 is electrically coupled to one of the semiconductor dies 218, and the capacitor 222 is electrically coupled to another one of the semiconductor dies 218. Alternatively, in an embodiment, the semiconductor package structure 200 may include two capacitors 228, wherein one capacitor 228 may be disposed below and electrically coupled to one of the semiconductor dies 218, and another capacitor 228 may be disposed below and electrically coupled to another one of the semiconductor dies 218.

Figure 7:
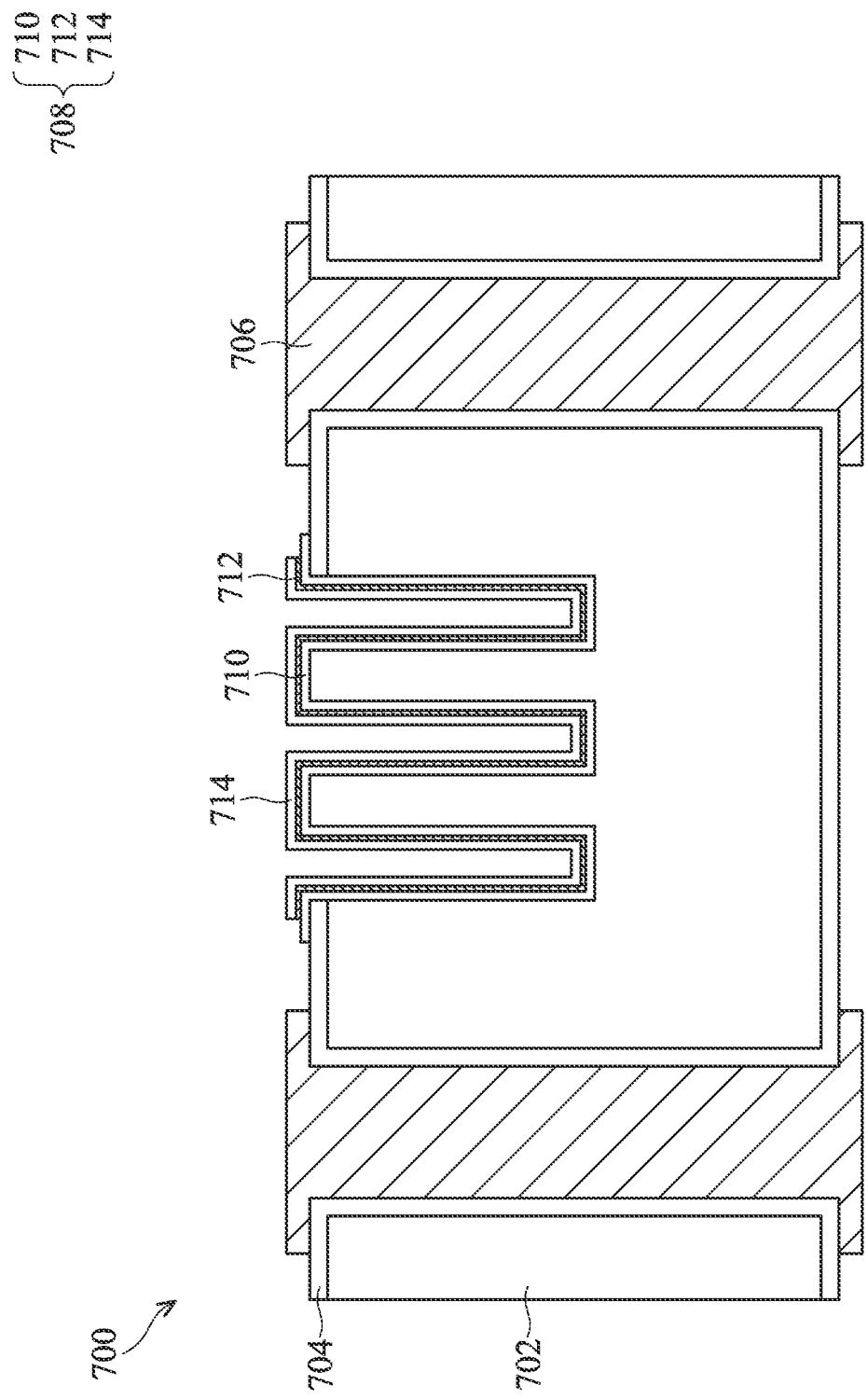
FIG. 7 is a cross-sectional view of an exemplary capacitor in accordance with some embodiments.

FIG. 7 is a cross-sectional view of a capacitor 700, in accordance with some embodiments of the present disclosure. Additional features can be added to the capacitor 700. Some of the features described below can be replaced or eliminated for different embodiments. To simplify the diagram, only a portion of the capacitor 700 is illustrated. In the following embodiments, the capacitor 700 which has a through via is described.

As shown in FIG. 7, the capacitor 700 includes a capacitor substrate 702, in accordance with some embodiments. The capacitor substrate 702 may be similar to the capacitor substrate 102 as shown in FIG. 1, and will not be repeated.

As shown in FIG. 7, the capacitor 700 includes an insulation layer 704 covering sidewalls of an opening, in accordance with some embodiments. The insulation layer 704 may extend from a first surface to a second surface of the capacitor substrate 702 through sidewalls of the opening. In some embodiments, the insulation layer 704 is formed of insulating material, including silicon oxide, silicon nitride, silicon oxynitride, the like, or a combination thereof.

As shown in FIG. 7, the capacitor 700 includes one or more through vias 706 embedded in the capacitor substrate 702, in accordance with some embodiments. The through vias 706 may be disposed in the opening and extend through the capacitor substrate 702. The through vias 706 may each be surrounded by the insulation layer 704. In some embodiments, the through vias 706 are formed of conductive material, including copper, aluminum, tungsten, the like, an alloy thereof, or a combination thereof.

As shown in FIG. 7, the capacitor 700 includes a metal-insulator-metal (MIM) structure 708 embedded in the capacitor substrate 702, in accordance with some embodiments. The MIM structure 708 may be disposed in trenches and may include a first electrode 710, an interlayer dielectric layer 712, and a second electrode 714. In some embodiments, the first electrode 710 and the second electrode 714 are each independently formed of conductive material, including copper, aluminum, tungsten, the like, an alloy thereof, or a combination thereof. The first electrode 710 and the second electrode 714 may be made of the same material or different materials. According to some embodiments, the interlayer dielectric layer 712 is formed of a high-k dielectric material, such as aluminum oxide.

The capacitor 700 may be adopted as one or more of the capacitors 220, 222, 226, 228 of the semiconductor package structure 200 as shown in FIG. 2. In particular, the capacitor 700 may be embedded in a substrate, disposed between a substrate and a redistribution layer, embedded in a redistribution layer, disposed between a redistribution layer and semiconductor dies, or a combination thereof, as mentioned above. The detailed description will not be repeated.

Figure 8:
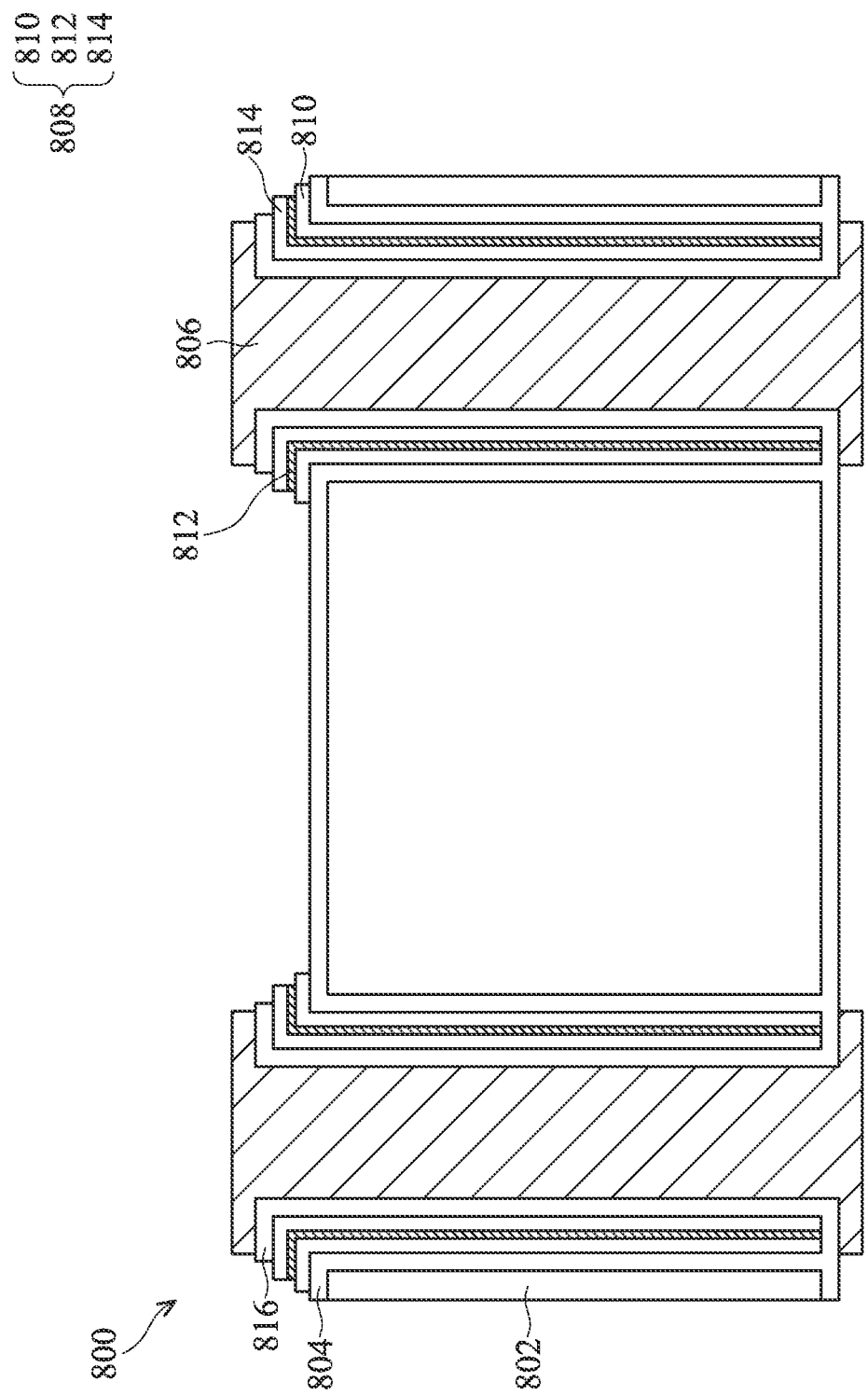
FIG. 8 is a cross-sectional view of an exemplary capacitor in accordance with some embodiments.

FIG. 8 is a cross-sectional view of a capacitor 800, in accordance with some embodiments of the present disclosure. Additional features can be added to the capacitor 800. Some of the features described below can be replaced or eliminated for different embodiments. To simplify the diagram, only a portion of the capacitor 800 is illustrated. In the following embodiments, the capacitor 800 which has a through via and a metal-insulator-metal (MIM) structure which surrounds the through via is described.

As shown in FIG. 8, the capacitor 800 includes a capacitor substrate 802, an insulation layer 804, and one or more through vias 806, in accordance with some embodiments. The capacitor substrate 802, the insulation layer 804, and the through vias 806 may be each similar to the capacitor substrate 702, the insulation layer 704, and the through vias 706 as shown in FIG. 7, and will not be repeated.

As shown in FIG. 8, the capacitor 800 includes a metal-insulator-metal (MIM) structure 808 embedded in the capacitor substrate 802 and disposed between the insulation layer 804 and the through vias 806, in accordance with some embodiments. The MIM structure 808 may include a first electrode 810, an interlayer dielectric layer 812, and a second electrode 814. In some embodiments, the first electrode 810 and the second electrode 814 are each independently formed of conductive material, including copper, aluminum, tungsten, the like, an alloy thereof, or a combination thereof. The first electrode 810 and the second electrode 814 may be made of the same material or different materials. In some embodiments, the interlayer dielectric layer 812 is formed of a high-k dielectric material, such as aluminum oxide.

As shown in FIG. 8, the capacitor 800 includes a barrier layer 816 embedded in the capacitor substrate 802 and disposed between the insulation layer 804 and the through vias 806, in accordance with some embodiments. The barrier layer 816 may surround each of the through vias 806 and function as a diffusion barrier. The barrier layer 816 may include titanium nitride or any suitable material.

The capacitor 800 may be adopted as one or more of the capacitors 220, 222, 226, 228 of the semiconductor package structure 200 as shown in FIG. 2. In particular, the capacitor 800 may be embedded in a substrate, disposed between a substrate and a redistribution layer, embedded in a redistribution layer, disposed between a redistribution layer and semiconductor dies, or a combination thereof, as mentioned above. The detailed description will not be repeated.

Figure 9:
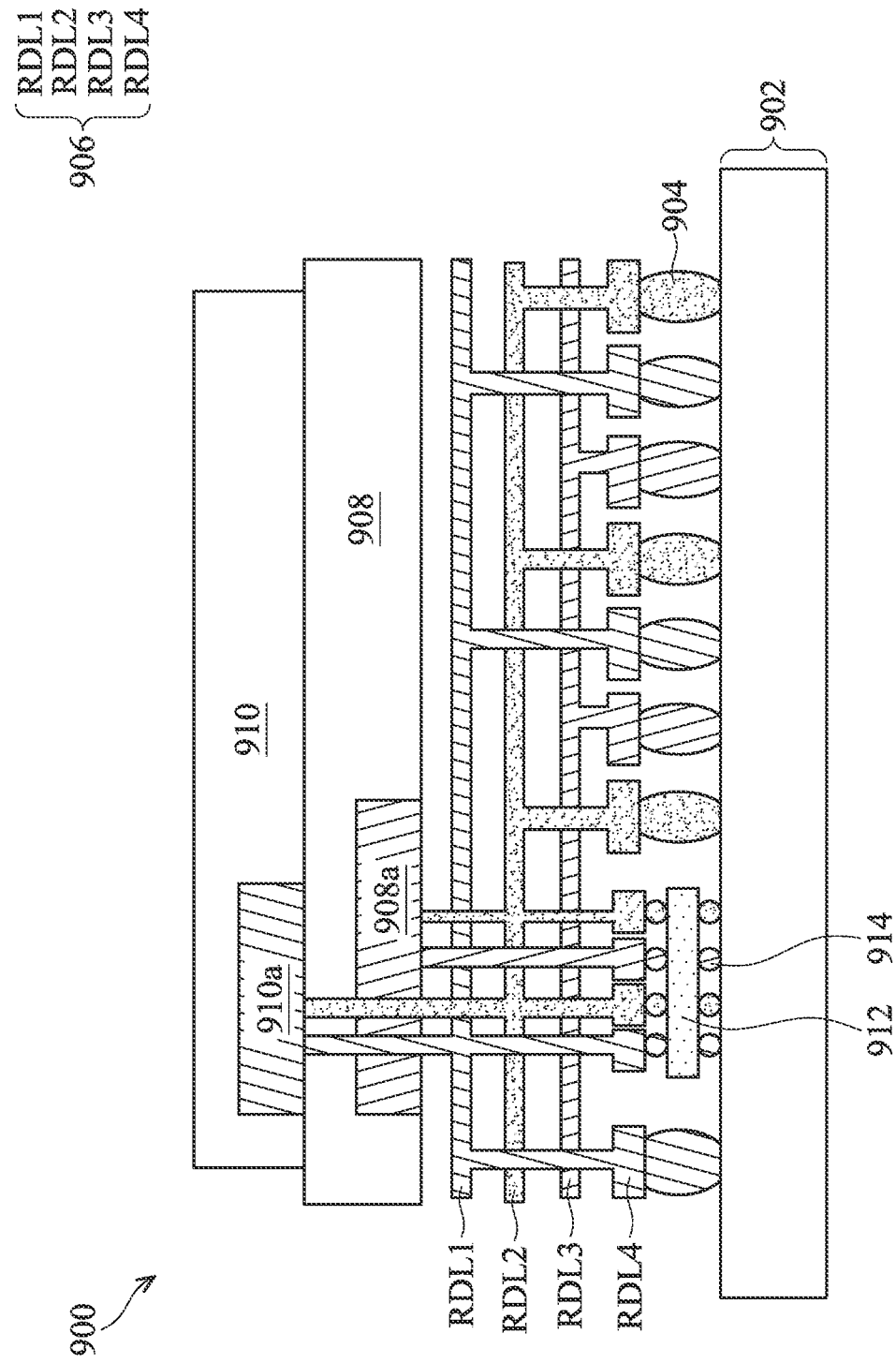
FIG. 9 is a cross-sectional view of an exemplary semiconductor package structure in accordance with some embodiments.

FIG. 9 is a cross-sectional view of a semiconductor package structure 900 in accordance with some embodiments of the present disclosure. Additional features can be added to the semiconductor package structure 900. Some of the features described below can be replaced or eliminated for different embodiments. To simplify the diagram, only a portion of the semiconductor package structure 900 is illustrated. In the following embodiments, the semiconductor package structure 900 includes a capacitor which has one or more through vias, wherein the capacitor includes a multi-capacitor structure to reduce the space occupied by the capacitors.

As shown in FIG. 9, the semiconductor package structure 900 includes a substrate 902, in accordance with some embodiments. The substrate 902 may be similar to the substrate 202 as shown in FIG. 2, and will not be repeated.

As shown in FIG. 9, the semiconductor package structure 900 includes a redistribution layer 906, which may include a plurality of conductive layers RDL1, RDL2, RDL3, and RDL4, in accordance with some embodiments. Four conductive layers RDL1, RDL2, RDL3, and RDL4 are shown for illustrative purposes only, and there may be more or fewer than four conductive layers. The redistribution layer 906 may be similar to the redistribution layer 210 as shown in FIG. 2, the conductive layers RDL1, RDL2, RDL3, and RDL4 may each be similar to the redistribution layer 212 as shown in FIG. 2, and will not be repeated.

As shown in FIG. 9, the semiconductor package structure 900 includes a plurality of bump structures 904 disposed between the redistribution layer 906 and the substrate 902 and electrically coupling the redistribution layer 906 to the substrate 902, in accordance with some embodiments. The bump structures 904 may be similar to the bump structures 208 as shown in FIG. 2, and will not be repeated.

As shown in FIG. 9, the semiconductor package structure 900 includes a first semiconductor die 908 and a second semiconductor die 910 stacked vertically over the redistribution layer 906, in accordance with some embodiments. The first semiconductor die 908 and the second semiconductor die 910 may each be similar to the semiconductor dies 218 as shown in FIG. 2, and will not be repeated.

It should be noted that two semiconductor dies 908 and 910 are shown for illustrative purposes only, and the semiconductor package structure 900 may include more than two semiconductor dies. In addition, according to some embodiments, the semiconductor package structure 900 includes one or more passive components (not illustrated) adjacent to the semiconductor dies 908 and 910, such as resistors, capacitors, inductors, the like, or a combination thereof.

As shown in FIG. 9, the first semiconductor die 908 may have a first XPU core 908a, and the second semiconductor die 910 may have a second XPU core 910a. The first XPU core 908a may be electrically coupled to the redistribution layer 906, and the second XPU core 910a may be electrically coupled to the redistribution layer 906 through a plurality of through vias in the first semiconductor die 908.

As shown in FIG. 9, the semiconductor package structure 900 includes a multi-capacitor structure 912 and a plurality of bump structures 914 between the redistribution layer 906 and the substrate 902, in accordance with some embodiments. The multi-capacitor structure 912 may be similar to the capacitor 100 as shown in FIG. 1, and will not be repeated.

As shown in FIG. 9, the bump structures 914 may be disposed on both surfaces of the multi-capacitor structure 912. The multi-capacitor structure 912 may be electrically coupled to the first semiconductor die 908 and the second semiconductor die 910 through the bump structures 914 and the redistribution layer 906. As mentioned above, the semiconductor package structure 900 may include more than two semiconductor dies, and thus the multi-capacitor structure 912 may be electrically coupled to more than two semiconductor dies.

As mentioned above, the dimensions (such as widths) of the bump structures 914 may be different on different surfaces of the multi-capacitor structure 912 since they may be electrically coupled to different components. For example, the dimensions (such as widths) of the bump structures 914 connecting the multi-capacitor structure 912 to the substrate 902 may be greater than the dimensions (such as widths) of the bump structures 914 connecting the multi-capacitor structure 912 to the redistribution layer 906.

Although not illustrated, an underfill material may be formed between the redistribution layer 906 and the substrate 902 and may fill in gaps between the multi-capacitor structure 912 and the bump structures 904 and 914 to provide structural support. The underfill material may surround each of the multi-capacitor structure 912 and the bump structures 904 and 914. In some embodiments, the underfill material is formed of polymer, such as epoxy. The underfill material may be dispensed with capillary force, and then be cured through any suitable curing process.

It should be noted that the multi-capacitor structure 912 disposed between the redistribution layer 906 and the substrate 902 is shown for illustrative purposes only, and the multi-capacitor structure 912 may be disposed as the capacitors 220, 222, 226, 228 of the semiconductor package structure 200 as shown in FIG. 2. That is, the multi-capacitor structure 912 may be embedded in the substrate 902, disposed between the substrate 902 and the redistribution layer 906, embedded in the redistribution layer 906, disposed between the redistribution layer 906 and semiconductor dies 908, 910, or a combination thereof, as mentioned above. The detailed description will not be repeated.

In addition, the semiconductor package structure 900 may include more than one multi-capacitor structures and more than two semiconductor dies. It should be understood that in the embodiment where the semiconductor package structure 900 has more than one capacitors, not all of the capacitors necessarily be multi-capacitor structures. Some capacitors may be multi-capacitor structures which are electrically coupled to two or more semiconductor dies, and some capacitors may be electrically coupled to one semiconductor die.

Compared to embodiments in which the semiconductor package structure includes separate capacitors for different semiconductor dies, the semiconductor package structure 900 uses the multi-capacitor structure 912 to electrically coupling to at least two semiconductor dies, and this can reduce the amount of space taken up by the capacitors. In addition, there can be more flexibility in the design.

In summary, in some embodiments, the semiconductor package structure according to the present disclosure has a capacitor which has a through via for electrically coupling to other components on both surfaces of the capacitor. Therefore, the capacitor can be a thermal dissipation path. As a result, the efficiency of thermal dissipation can be improved. In addition, the semiconductor package structure with high current density can be achieved. Furthermore, the pin map can be freely assigned. Consequently, there can be more flexibility in the design of the semiconductor package structure.

Additionally, in some embodiments, the semiconductor package structure according to the present disclosure includes a multi-capacitor structure which can be electrically coupled to two or more semiconductor dies. As a result, multiple capacitors can be integrated, the amount of space taken up by the capacitors can be reduced, and there can be more flexibility in the design.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a substrate having a wiring structure;
a redistribution layer disposed over the substrate;
a first semiconductor die disposed over the redistribution layer;
a first capacitor disposed in the substrate and electrically coupled to the first semiconductor die, wherein the first capacitor comprises:
a first capacitor substrate having a first top surface and a first bottom surface;
a plurality of first capacitor cells disposed in the first capacitor substrate; and
a first through via disposed in the first capacitor substrate and electrically coupling the plurality of first capacitor cells to the wiring structure of the substrate on the first top surface and the first bottom surface of the first capacitor substrate;
a plurality of first bump structures disposed over the substrate; and
a second capacitor adjacent to the plurality of first bump structures.

2. The semiconductor package structure as claimed in claim 1, further comprising:
a second semiconductor die disposed over the redistribution layer; and
a plurality of second bump structures disposed on both surfaces of the second capacitor,
wherein the plurality of first bump structures are disposed between the redistribution layer and the substrate, and the second capacitor is electrically coupled to the second semiconductor die.

3. The semiconductor package structure as claimed in claim 2, wherein a dimension of each of the plurality of second bump structures connecting the second capacitor to the substrate is greater than a dimension of each of the plurality of second bump structures connecting the second capacitor to the redistribution layer.

4. The semiconductor package structure as claimed in claim 2, wherein the second capacitor comprises:
- a second capacitor substrate;
- a plurality of second capacitor cells disposed in the second capacitor substrate; and
- a second through via disposed in the second capacitor substrate and electrically coupling the plurality of second capacitor cells to the redistribution layer and the substrate.

5. The semiconductor package structure as claimed in claim 1, further comprising:
- a second semiconductor die disposed over the redistribution layer; and
- a third capacitor embedded in the redistribution layer and electrically coupled to the second semiconductor die.

6. The semiconductor package structure as claimed in claim 5, wherein the third capacitor comprises:
- a second capacitor substrate having a second top surface and a second bottom surface;
- a plurality of second capacitor cells disposed in the second capacitor substrate; and
- a second through via disposed in the second capacitor substrate and electrically coupling the plurality of second capacitor cells to conductive layers of the redistribution layer on the second top surface and the second bottom surface.

7. The semiconductor package structure as claimed in claim 5, further comprising a fourth capacitor disposed between the redistribution layer and the substrate and electrically coupled to a third semiconductor die.

8. The semiconductor package structure as claimed in claim 1, further comprising:
- a second semiconductor die disposed over the redistribution layer;
- a plurality of third bump structures disposed between the first semiconductor die and the redistribution layer;
- a third capacitor disposed between the second semiconductor die and the redistribution layer; and
- a plurality of third bump structures disposed on both surfaces of the third capacitor and electrically coupling the second capacitor to the second semiconductor die.

9. The semiconductor package structure as claimed in claim 8, wherein the third capacitor comprises:
- a second capacitor substrate;
- a plurality of second capacitor cells disposed in the second capacitor substrate; and
- a second through via disposed in the second capacitor substrate and electrically coupling the plurality of second capacitor cells to the plurality of second bump structures.

10. The semiconductor package structure as claimed in claim 8, further comprising an underfill layer surrounding the plurality of third bump structures and the third capacitor.

11. The semiconductor package structure as claimed in claim 8, further comprising a fourth capacitor disposed between the redistribution layer and the substrate and electrically coupled to a third semiconductor die.

12. The semiconductor package structure as claimed in claim 8, further comprising a fourth capacitor embedded in the redistribution layer and electrically coupled to a third semiconductor die.

13. The semiconductor package structure as claimed in claim 1, wherein the first capacitor comprises a multi-capacitor structure and is electrically coupled to a second semiconductor die.

14. A semiconductor package structure, comprising:
- a substrate having a wiring structure;
- a redistribution layer disposed over the substrate;
- a first semiconductor die and a second semiconductor die disposed over the redistribution layer;
- a first multi-capacitor structure disposed between the redistribution layer and the substrate and electrically coupled to the first semiconductor die and the second semiconductor die, wherein the first multi-capacitor structure comprises:
- a capacitor substrate;
- a plurality of capacitor cells disposed in the capacitor substrate; and
- a first through via disposed in the capacitor substrate and electrically coupling the plurality of capacitor cells to the redistribution layer and the wiring structure of the substrate;
- a plurality of first bump structures adjacent to the first multi-capacitor structure; and
- a plurality of second bump structures disposed on both surfaces of the capacitor substrate and electrically coupled to the first through via.

15. The semiconductor package structure as claimed in claim 14, wherein a dimension of each of the plurality of second bump structures connecting the second multi-capacitor structure to the substrate is greater than a dimension of each of the plurality of second bump structures connecting the second multi-capacitor structure to the redistribution layer.

16. The semiconductor package structure as claimed in claim 14, further comprising:
- a third semiconductor die and a fourth semiconductor die disposed over the redistribution layer; and
- a second multi-capacitor structure embedded in the substrate, wherein the second multi-capacitor structure comprises a second through via and is electrically coupled to the third semiconductor die and the fourth semiconductor die.

17. The semiconductor package structure as claimed in claim 14, further comprising:
- a third semiconductor die and a fourth semiconductor die disposed over the redistribution layer; and
- a second multi-capacitor structure embedded in the redistribution layer, wherein the second multi-capacitor structure comprises a second through via and is electrically coupled to the third semiconductor die and the fourth semiconductor die.

18. The semiconductor package structure as claimed in claim 14, further comprising:
- a third semiconductor die and a fourth semiconductor die disposed over the redistribution layer; and
- a second multi-capacitor structure disposed between the third semiconductor die and the redistribution layer or between the fourth semiconductor die and the redistribution layer, wherein the second multi-capacitor structure comprises a second through via and is electrically coupled to the third semiconductor die and the fourth semiconductor die.

19. The semiconductor package structure as claimed in claim 18, further comprising:
- a plurality of bump structures disposed on both surfaces of the second multi-capacitor structure; and
- an underfill layer surrounding the plurality of bump structures and the second multi-capacitor structure.

* * * * *